(12) United States Patent
Dobi (10) Patent No.: US 9,691,566 B2
(45) Date of Patent: Jun. 27, 2017

(54) STATE AND OPERATION INDICATOR FOR A SWITCH

(71) Applicant: Stevan Dobi, Edmonton (CA)

(72) Inventor: Stevan Dobi, Edmonton (CA)

(73) Assignee: PITYU CONTROLS INC., Edmonton (CA)

( * ) Notice: Subject to any disclaimer, the term of this patent is extended or adjusted under 35 U.S.C. 154(b) by 120 days.

(21) Appl. No.: 14/434,717

(22) PCT Filed: Oct. 23, 2013

(86) PCT No.: PCT/CA2013/000905
§ 371 (c)(1),
(2) Date: Apr. 9, 2015

(87) PCT Pub. No.: WO2014/063230
PCT Pub. Date: May 1, 2014

(65) Prior Publication Data
US 2015/0270074 A1    Sep. 24, 2015

Related U.S. Application Data (60) Provisional application No. 61/718,296, filed on Oct. 25, 2012.

(51) Int. Cl.
*H01H 5/00* (2006.01)
*H01H 9/16* (2006.01)
(Continued)

(52) U.S. Cl.
CPC .......... *H01H 9/161* (2013.01); *G01R 31/045* (2013.01); *H01H 9/16* (2013.01); *H01H 13/26* (2013.01);
(Continued)

(58) Field of Classification Search
CPC ...... H01H 5/00; H01H 21/025; H01H 23/025; H01H 73/12; H01H 9/161; H01H 9/16;
(Continued)

(56) References Cited

U.S. PATENT DOCUMENTS 1,960,020 A * 5/1934 McGall ................. H01H 13/36
200/460
3,696,364 A * 10/1972 Lavelle ................ H01H 47/002
340/531

(Continued)

FOREIGN PATENT DOCUMENTS

CA       2 271 336 A1    7/1999

OTHER PUBLICATIONS

International Search Report and Written Opinion mailed Jan. 22, 2014, corresponding International Application No. PCT/CA2013/000905, filed Oct. 23, 2013, 6 pages.

*Primary Examiner* — Anthony R. Jimenez
(74) *Attorney, Agent, or Firm* — Christensen O'Connor Johnson Kindness PLLC (57) ABSTRACT

A state and operation indicator for a snap switch is provided. Presently, instrumentation is often needed in order to determine if a snap switch is malfunctioning. Information may be provided on a control panel inconveniently positioned remotely as compared with the location of the snap switch itself. This disclosure provides for an indicator of the state and operation of a snap switch, which does not require the use of instrumentation, and which is proximate the snap switch. This indicator can be used in both alternating and direct current circuits. When the common terminal of the switch is energized an associated light can provide a cue that the power is on. The state and operation indicator can also have either a light associated with the normally open terminal, a light associated with the normally closed terminal, (Continued)

or both. These lights can respond to indicate the state and operation of the switch.

20 Claims, 5 Drawing Sheets (51) Int. Cl.
G01R 31/04 (2006.01)
H01H 13/26 (2006.01)
H01H 13/36 (2006.01)

(52) U.S. Cl.
CPC ......... H01H 13/36 (2013.01); H01H 2207/04 (2013.01); H01H 2219/036 (2013.01)

(58) Field of Classification Search
CPC .... H01H 13/26; H01H 13/36; H01H 2207/04; H01H 2219/036; G01R 31/045
USPC ... 200/402, 310, 50.26, 56 R, 308, 315, 317
See application file for complete search history.

(56) References Cited

U.S. PATENT DOCUMENTS

| | | | |
|---|---|---|---|
| 4,929,932 A | 5/1990 | Shipkowski | |
| 5,245,519 A * | 9/1993 | Openiano | F21S 4/10 |
| | | | 362/249.01 |
| 6,903,289 B2 | 6/2005 | Tongo | |
| 8,376,606 B2 * | 2/2013 | Yu | F21V 17/06 |
| | | | 362/652 |

* cited by examiner

STATE AND OPERATION INDICATOR FOR A SWITCH

CROSS REFERENCE TO RELATED APPLICATIONS

This application claims priority of U.S. Provisional Patent Application Ser. No. 61/718,296, entitled "State and Operation Indicator for a Switch", filed Oct. 25, 2012, and hereby incorporates the same provisional application by reference herein in its entirety.

TECHNICAL FIELD

This invention provides a state and operation indicator, in particular one adapted for use with a snap switch.

BACKGROUND

Snap switches are currently used in a variety of devices having a linear and/or angular motion and requiring a limit to that motion. The snap switch was disclosed by Philip Kenneth McGall, in U.S. Pat. No. 1,960,020 (incorporated by reference into this application in its entirety), filed in 1933. The McGall snap switch, however, does not include an indicator to show the state of the switch. This means that there is no indication if the snap switch is energized or not, and/or operation, meaning if the snap switch is in normally open position or in normally closed position of the snap switch. To check the state and/or operation of the McGall snap switch the operator has to use instrumentation.

A safety device monitoring system, as disclosed in U.S. Pat. No. 3,696,364 (incorporated by reference into this application in its entirety), granted to Michael R. Lavelle in 1972, was designed for use in monitoring a safety device switch, which is used in an alternating current circuit. The circuit has many components and requires a separate direct current power supply. While monitoring circuits of this type have been useful for their intended purposes, they have been limited not only by their complexity and difficulty of mounting the large number of components but also by the fact that they only monitor switch outputs, open or close, and do not monitor the switch input. In addition, they are restricted to use with monitoring alternating current circuits.

Similarly, a solid state relay having a visual contact monitor is disclosed in the 1990 U.S. Pat. No. 4,929,932 (incorporated by reference into this application in its entirety) to James P. Shipkowshi and the Eastman Kodak Company. This patent provides for a visual indication system for delivering information about the status of the output terminals of a solid state relay. Again, while these monitoring circuits have been useful for their intended purpose; they are limited to monitor output terminals in alternating current circuits only and they do not offer a means of directly monitoring a switch input at the switch itself.

Therefore there remains a need for a device that provides a direct means of indicating the state and operation of a snap switch in both alternating and direct current circuit situations without the use of instrumentation.

SUMMARY

A state and operation indicator for a snap switch is provided. Presently, instrumentation is often needed in order to determine if a snap switch is functioning or is malfunctioning. Information may be provided on a control panel inconveniently positioned remotely as compared with the location of the snap switch itself. This disclosure provides for an indicator of the state and operation of a snap switch, which does not require the use of instrumentation, and which is proximate the snap switch. This indicator can be used in both alternating and direct current circuits. When the common (COM) terminal of the switch is energized an associated light can provide a cue that the power is on. The state and operation indicator can also have either a light associated with the normally open (NO) terminal, a light associated with the normally closed (NC) terminal, or both. These lights can respond to indicate the state and operation of the switch.

In some embodiments, a state and operation indicator is provided for use with a snap switch, which can combine at least two connectors, one connector connecting to a COM terminal and the other connector connecting to a NO or NC terminal on the snap switch, a circuit board and at least two light emitting devices (LEDs) and light emitting device (LED) drivers. When the terminal on the snap switch is energized, be it the COM, NO, or NC terminal, the current can pass into the associated connector, through the circuit board and LED driver, ending at the LED. The result is that light can be emitted providing an indication of which terminal(s) are energized that is associated with the snap switch itself.

This state and operation indicator for a snap switch can have at least two or three LEDs to indicate the COM terminal is energized along with either or both the NO and NC terminals.

Broadly stated, in some embodiments, state and operation indicator is provided for a snap switch having a common, a normally closed and/or a normally open terminal, the indicator comprising: a common connector providing electric communication between the common terminal at one end of the common connector and a printed circuit board at the opposing end of the common connector, wherein the printed circuit board is configured to be positioned proximate the snap switch; and a first light emitting device and a first light emitting device driver attached to the printed circuit board, wherein the first light emitting device is powered through the first light emitting device driver; wherein when the common terminal is energized, current is transmitted through the common connector, printed circuit board, and first light emitting device driver to the first light emitting device, which in response emits light; and a normally open connector providing electric communication between the normally open terminal at one end of the normally open connector and a printed circuit board at the opposing end of the normally open connector; and a second light emitting device and a second light emitting device driver attached to the printed circuit board, wherein the second light emitting device is powered through the second light emitting device driver; wherein when the switch is activated, the normally open terminal closes causing current to pass through the normally open terminal, the current is transmitted through the normally open connector, printed circuit board, and second light emitting device driver to the second light emitting device, which in response emits light; and a wire terminal connected to the printed circuit board and a power supply for sinking currents which pass through the light emitting devices.

Broadly stated, in some embodiments, state and operation indicator is provided for a snap switch having a common, a normally closed and/or a normally open terminal, the indicator comprising: a common connector providing electric communication between the common terminal at one end of the common connector and a printed circuit board at the opposing end of the common connector, wherein the printed circuit board is configured to be positioned proximate the snap switch; and a first light emitting device and a first light emitting device driver attached to the printed circuit board, wherein the first light emitting device is powered through the first light emitting device driver; wherein when the common terminal is energized, current is transmitted through the common connector and printed circuit board to the first light emitting device, which in response emits light; and a normally closed connector providing electric communication between the normally closed terminal at one end of the normally closed connector and a printed circuit board at the opposing end of the normally closed connector; and a second light emitting device and a second light emitting device driver attached to the printed circuit board, wherein the second light emitting device is powered through the second light emitting device driver; wherein when the switch is not activated, the normally closed terminal remains closed causing current to pass through the closed terminal, the current is transmitted through the normally closed connector, printed circuit board, and the second light emitting device driver to the second light emitting device, which in response emits light; and a wire terminal connected to the printed circuit board and a power supply for sinking currents which pass through the light emitting devices.

Broadly stated, in some embodiments, state and operation indicator is provided for a snap switch having a common, a normally closed and/or a normally open terminal, the indicator comprising: a common connector providing electric communication between the common terminal at one end of the common connector and a printed circuit board at the opposing end of the common connector, wherein the printed circuit board is configured to be positioned proximate the snap switch; and a first light emitting device and a first light emitting device driver attached to the printed circuit board, wherein the first light emitting device is powered through the first light emitting device driver; wherein when the common terminal is energized, current is transmitted through the common connector, printed circuit board, and the first light emitting device driver to the first light emitting device, which in response emits light; and a normally open connector providing electric communication between the normally open terminal at one end of the normally open connector and a printed circuit board at the opposing end of the open connector; and a second light emitting device and a second light emitting device driver attached to the printed circuit board, wherein the second light emitting device is powered through the second light emitting device driver; wherein when the switch is activated, the normally open terminal closes causing current to pass through the normally open terminal, the current is transmitted through the normally open connector, printed circuit board, and the second light emitting device driver to the second light emitting device, which in response emits light; and a normally closed connector providing electric communication between the normally closed terminal at one end of the normally closed connector and a printed circuit board at the opposing end of the normally closed connector; and a third light emitting device and a third light emitting device driver attached to the printed circuit board, wherein the third light emitting device is powered through the third light emitting device driver; wherein when the normally closed terminal closes causing current to pass through the normally closed terminal, the current is transmitted through the closed connector, printed circuit board, and the third light emitting device driver to the third light emitting device, which in response emits light; and a wire terminal connected to the printed circuit board and a power supply for sinking currents which pass through the light emitting devices.

In some embodiments, the state and operation indicator can be removably connected to the snap switch, or it can be permanently connected to the snap switch, and/or it can be permanently built integrally with the snap switch.

DETAILED DESCRIPTION

Figure 1:
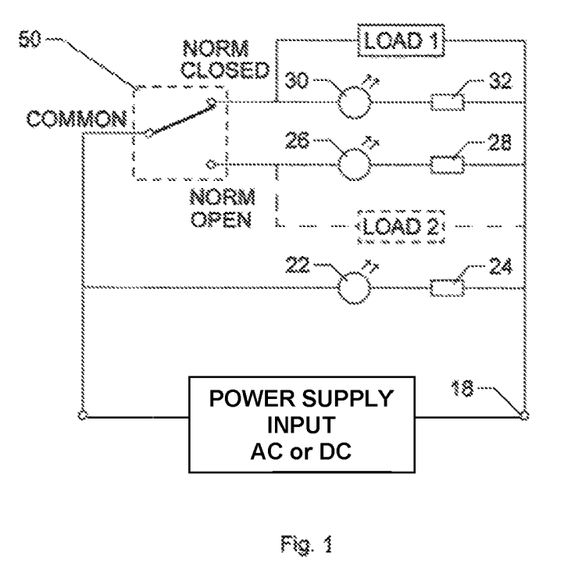
FIG. 1 is an electronic schematic depicting an embodiment of a state and operation indicator circuit in the context of a power supply and a load with a switch in the normally closed position.
Figure 2:
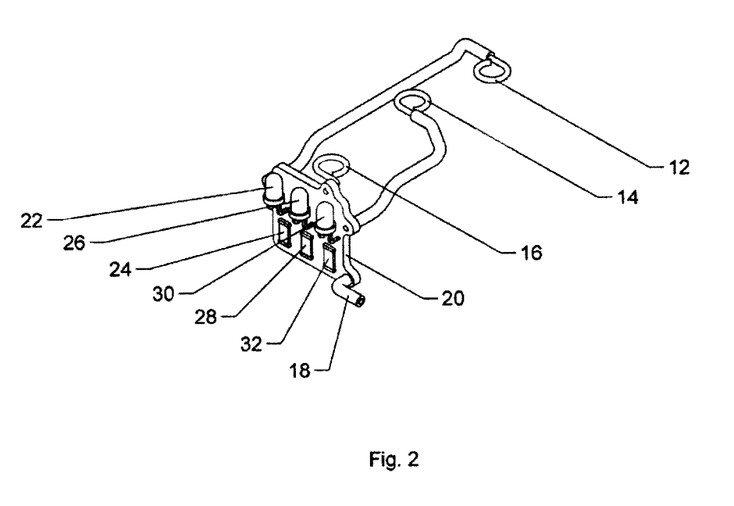
FIG. 2 is a perspective view depicting an embodiment of a front-rear mount state and operation indicator.
Figure 3:
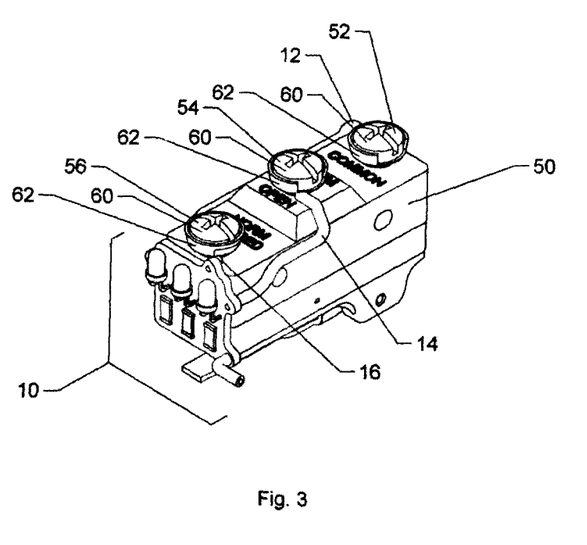
FIG. 3 is a perspective view depicting the front-rear mount state and operation indicator shown in FIG. 2 mounted onto a snap switch.
Figure 4:
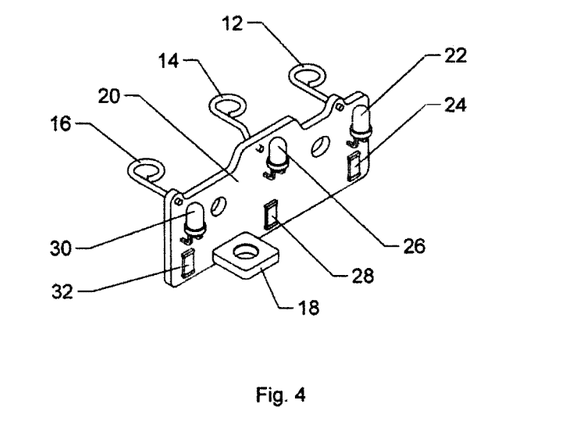
FIG. 4 is a perspective view depicting an embodiment of a side mount state and operation indicator.
Figure 5:
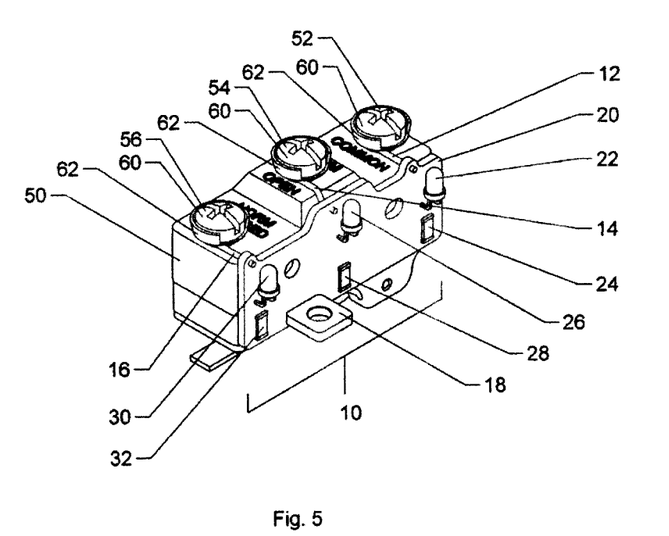
FIG. 5 is a perspective view depicting the side mount state and operation indicator shown in FIG. 4 mounted onto a snap switch.

Embodiments of a state and operation indicator 10 are shown in FIGS. 1-5. FIG. 1 is an electronic schematic of an embodiment of a state and operation indicator in the context of a power supply and a load with a switch in a normally closed (NC) position. It would be understood that a load can be present in a NC circuit, normally open (NO) circuit, or in both circuits. FIG. 1 shows a circuit that includes an optional second load connected to the normally open terminal of the switch. In this embodiment, when load 1 is turned off, load 2 is turned on, while when load 2 is turned off, load 1 is turned on. While FIGS. 2 and 3 show an embodiment of a front/rear-mounted indicator and FIGS. 4 and 5 show an embodiment of a side-mounted indicator, both devices can have common components.

In some embodiment, state and operation indicator 10 can have three connectors for removably connecting to the terminals of snap switch 50. It would be understood by one skilled in the art that indicator 10 can be adapted to connect to many different types of switches, including but not limited to, the McGall switch referred to in the background section, Honeywell™ brand switches, or switches made by other manufactures such as Burgess™, Cherry™ Omron™, Panasonic™, and many original equipment manufacturer (OEM) brand switches, various microswitches as are known in the art, or any other switch with a similar function. In some embodiments, Honeywell™ uses the name "Micro Switch"™ for their micro-snap switches such as: Premium Large Basic Switches, Series: BA,BE,BM,BZ,WA,WM,W-Z,YA,YE,YM,YZ,DT, Standard V-Basic Switches, Series: V7,V15, Premium Miniature and Subminiature Switches, Series: SM,SX, and Standard Miniature and Subminiature Switches, Series: ZD,ZM.

A common connector 12 can removably connect to a common (COM) terminal 52, a NO connectors 14 can removably connect to a NO terminal 54 and a NC connector 16 can removably connect to NC terminal 56.

At their ends which are not connected to the terminals, COM connector 12, NO connector 14, and NC connector 16 can be attached to a printed circuit board 20. These connectors can be made of a material that allows conduction of electricity and for the passage of current from the terminals on snap switch 50 to printed circuit board 20. For example, these connectors could be made of metal, or other conductive materials as would be known to one skilled in the art.

Corresponding traces on a printed circuit board 20 can feed power to a first, second, and third light emitting device (LED), 22, 26, and 30, respectively through their associated first, second and third LED driver, 24, 28 and 32, respectively. Drivers can comprise, for example, a resistor and/or diode, whether surface-mount or not, or a solid state device, but different or more complicated drivers, as known in the art, can be used as necessary depending on the voltage applied to the LED.

The LEDs could comprise any type of device which emits light, for example, an incandescent light bulb, neon light bulb, halogen, or light emitting diode, etc. and could emit any type of light (whether or not visible to the human eye, or detectable by some other means), including, but not limited to, incandescent, neon, fluorescent, electroluminescent, or light emitting diode light. The LEDs can be in different colours or different shapes to provide an operator with a means to quickly recognize which LED is lit or not lit. In some embodiments, the LEDs can comprise different shapes such as letters, words, numbers, or symbols, for example, the letters COM, NC, NO or others.

In some embodiments, state and operation indicator 10 can also comprise a wire terminal 18, which can connect to a power supply, which has the opposite polarity to the power supplied to snap switch 50 at COM terminal 52. The wire terminal 18 can be connected to a neutral line in the case of an alternating current power supply or to a negative line in the case of a direct current power supply. In some embodiments, wire terminal 18 can be connected to a line of the opposite polarity of the power supplied to the switch 50. As such, wire terminal 18, connected to printed circuit board 20 and a power supply, can sink currents which pass through the LEDs.

When state and operation indicator 10 is attached to snap switch 50, as shown in either FIG. 3 or 5, and COM terminal 52 is energized, a current can flow through first LED driver 24 causing the first LED 22 to emit light (or some other appropriate signal) thus indicating that the snap switch 50 is energized.

When snap switch 50 is energized and operated to a normally open position, the NO terminal 54 closes and becomes energized. This in turn can energize second LED driver 28 causing the second LED 26 to emit light (or some other appropriate signal) thus indicating that the snap switch 50 is open.

With snap switch 50 energized, and in a normally closed position, NC terminal 56 can be energized, and a current can flow through the third LED driver 32 causing the third LED 30 to emit light (or some other appropriate signal) thus indicating that the snap switch 50 is closed.

LEDs, 22, 26 and 30, can provide an indication, for example a visual indication, of which terminal of the snap switch 50 is energized, thereby allowing for quick review of the state of the snap switch 50 and preventing the need to use instrumentation to adjust and/or troubleshoot the operation of snap switch 50.

While the figures provided show a state and operation indicator 10 that has three LEDs, 22, 26 and 30, it will be appreciated by a person skilled in the art that the removal of either the second or third light and associated drivers and connectors, but not the common, would not depart from the scope of the invention. In addition, the state and operation indicator 10 may be mounted on a snap switch 50 in a variety of orientations, although only the front-rear and side mount have been specifically shown.

In some embodiments, printed circuit board 20 can be configured to be positioned proximate, or attached to, the snap switch 50. With the printed circuit board 20 and the light indicators not being remote from the snap switch 50 (as in prior art control panels), the state and operation of snap switch 50 can be monitored directly as opposed to remotely. As such, it can be more efficient for a user to service, monitor, maintain, trouble-shoot, handle, repair, replace, or otherwise alter snap switch 50.

This state and operation indicator for a snap switch can be attached at the time of snap switch assembly, or at a later time, even after the snap switch has been installed. The means for attaching the state and operation indicator 10 to the snap switch 50 can be removable, for example using screws and screw-holes as shown in FIGS. 4 and 5, or more permanent, for example being glued or soldered. In some embodiments, it can be sufficient for the connectors or wires around the terminals to connect and support printed circuit board 20 proximate snap switch 50 when the connectors are of sufficient durability and strength in order to keep printed circuit board 20 attached to snap switch 50.

In some embodiments, the connectors can form a wire loop to attach to the snap switch 50 at the terminals which can comprise screws 60 and washers 62. Such wire loops can tie around the neck of screw 60 underneath the head of screw 60 and washer 62. Connections to the load and other aspects of the circuit that the switch is controlling, however, can be connected at screw 60 above washer 62.

Although particular embodiments have been shown and described, it will be appreciated by those skilled in the art that various changes and modifications might be made without departing from the scope of the invention. The terms and expressions used in the preceding specification have been used herein as terms of description and not of limitation, and there is no intention in the use of such terms and expressions of excluding equivalents of the features shown and described or portions thereof, it being recognized that the invention is defined and limited only by the claims that follow.

I claim:

1. A state and operation indicator for a snap switch having a common, a normally closed and/or a normally open terminal, comprising:
   a common connector providing electric communication between the common terminal at one end of the common connector and a printed circuit board at an opposing end of the common connector, wherein the printed circuit board is configured to be positioned proximate the snap switch; and
   a first light emitting device and a first light emitting device driver attached to the printed circuit board, wherein the first light emitting device is powered through the first light emitting device driver;
   wherein, irrespective of whether the normally open terminal is closed or open, and irrespective of whether the normally closed terminal is closed or open, when the common terminal is energized, current is transmitted through the common connector, printed circuit board, and first light emitting device driver to the first light emitting device, which in response emits light; and
   a normally open connector providing electric communication between the normally open terminal at one end of the normally open connector and the printed circuit board at an opposing end of the normally open connector; and a second light emitting device and a second light emitting device driver attached to the printed circuit board, wherein the second light emitting device is powered through the second light emitting device driver;

wherein when the switch is activated, the normally open terminal closes causing current to pass through the normally open terminal, the current is transmitted through the normally open connector, printed circuit board, and second light emitting device driver to the second light emitting device, which in response emits light; and a wire terminal connected to the printed circuit board and a power supply for sinking currents which pass through the light emitting devices.

2. The state and operation indicator of claim 1 wherein the state and operation indicator is configured to be permanently connected to the snap switch and positioned proximate the snap switch.

3. The state and operation indicator of claim 1 wherein the state and operation indicator is permanently built integrally with the snap switch.

4. The state and operation indicator of claim 1 wherein the state and operation indicator is configured to be mountable on the side of the snap switch.

5. The state and operation indicator of claim 1 wherein the state and operation indicator is configured to be mountable on the front of the snap switch.

6. The state and operation indicator of claim 1 wherein the state and operation indicator is configured to be mountable on the rear of the snap switch.

7. The state and operation indicator of claim 1 wherein the light emitting device comprises a device selected from the group consisting of an incandescent light bulb, neon light bulb, halogen, and light emitting diode.

8. The state and operation indicator of claim 1 wherein the light emitting device comprises a shape selected from the group consisting of letters, words, numbers, symbols, and a combination thereof.

9. The state and operation indicator of claim 8 wherein the light emitting device comprises a shape selected from the group consisting of COM, NC, and NO.

10. The state and operation indicator of claim 1 wherein the state and operation indicator is configured to be removably connected to the snap switch and positioned proximate the snap switch.

11. The state and operation indicator of claim 10 wherein the state and operation indicator comprises connectors to removably connect the indicator to the snap switch.

12. The state and operation indicator of claim 11 wherein the connectors comprise a wire loop to attach to terminals on the snap switch.

13. A state and operation indicator for a snap switch having a common, a normally closed and/or a normally open terminal, comprising:

a common connector providing electric communication between the common terminal at one end of the common connector and a printed circuit board at an opposing end of the common connector, wherein the printed circuit board is configured to be positioned proximate the snap switch; and a first light emitting device and a first light emitting device driver attached to the printed circuit board, wherein the first light emitting device is powered through the first light emitting device driver;

wherein, irrespective of whether the normally open terminal is closed or open, and irrespective of whether the normally closed terminal is closed or open, when the common terminal is energized, current is transmitted through the common connector and printed circuit board to the first light emitting device, which in response emits light; and a normally closed connector providing electric communication between the normally closed terminal at one end of the normally closed connector and the printed circuit board at an opposing end of the normally closed connector; and a second light emitting device and a second light emitting device driver attached to the printed circuit board, wherein the second light emitting device is powered through the second light emitting device driver;

wherein when the switch is not activated, the normally closed terminal remains closed causing current to pass through the closed terminal, the current is transmitted through the normally closed connector, printed circuit board, and the second light emitting device driver to the second light emitting device, which in response emits light; and a wire terminal connected to the printed circuit board and a power supply for sinking currents which pass through the light emitting devices.

14. The state and operation indicator of claim 13 wherein the state and operation indicator is configured to be removably connected to the snap switch and positioned proximate the snap switch.

15. The state and operation indicator of claim 14 wherein the state and operation indicator comprises connectors to removably connect the indicator to the snap switch.

16. The state and operation indicator of claim 15 wherein the connectors comprise a wire loop to attach to terminals on the snap switch.

17. A state and operation indicator for a snap switch having a common, a normally closed and/or a normally open terminal, comprising:

a common connector providing electric communication between the common terminal at one end of the common connector and a printed circuit board at an opposing end of the common connector, wherein the printed circuit board is configured to be positioned proximate the snap switch; and a first light emitting device and a first light emitting device driver attached to the printed circuit board, wherein the first light emitting device is powered through the first light emitting device driver;

wherein, irrespective of whether the normally open terminal is closed or open, and irrespective of whether the normally closed terminal is closed or open, when the common terminal is energized, current is transmitted through the common connector, printed circuit board, and the first light emitting device driver to the first light emitting device, which in response emits light; and a normally open connector providing electric communication between the normally open terminal at one end of the normally open connector and the printed circuit board at an opposing end of the open connector; and a second light emitting device and a second light emitting device driver attached to the printed circuit board, wherein the second light emitting device is powered through the second light emitting device driver;

wherein when the switch is activated, the normally open terminal closes causing current to pass through the normally open terminal, the current is transmitted through the normally open connector, printed circuit board, and the second light emitting device driver to the second light emitting device, which in response emits light; and a normally closed connector providing electric communication between the normally closed terminal at one end of the normally closed connector and the printed circuit board at an opposing end of the normally closed connector; and a third light emitting device and a third light emitting device driver attached to the printed circuit board, wherein the third light emitting device is powered through the third light emitting device driver;

wherein when the normally closed terminal closes causing current to pass through the normally closed terminal, the current is transmitted through the closed connector, printed circuit board, and the third light emitting device driver to the third light emitting device, which in response emits light; and a wire terminal connected to the printed circuit board and a power supply for sinking currents which pass through the light emitting devices.

18. The state and operation indicator of claim 17 wherein the state and operation indicator is configured to be removably connected to the snap switch and positioned proximate the snap switch.

19. The state and operation indicator of claim 18 wherein the state and operation indicator comprises connectors to removably connect the indicator to the snap switch.

20. The state and operation indicator of claim 19 wherein the connectors comprise a wire loop to attach to terminals on the snap switch.

\* \* \* \* \*